United States Patent
Kwon

(10) Patent No.: US 11,531,054 B2
(45) Date of Patent: Dec. 20, 2022

(54) IGBT/MOSFET FAULT PROTECTION

(71) Applicant: SEMICONDUCTOR COMPONENTS INDUSTRIES, LLC, Phoenix, AZ (US)

(72) Inventor: Taesung Kwon, Bucheon-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 180 days.

(21) Appl. No.: 16/826,881

(22) Filed: Mar. 23, 2020

(65) Prior Publication Data
US 2021/0293874 A1 Sep. 23, 2021

(51) Int. Cl.
H02H 9/00 (2006.01)
G01R 31/26 (2020.01)
H02H 1/00 (2006.01)
H02H 3/08 (2006.01)
H02H 9/02 (2006.01)

(52) U.S. Cl.
CPC ..... G01R 31/2608 (2013.01); G01R 31/2621 (2013.01); H02H 1/0007 (2013.01); H02H 3/08 (2013.01); H02H 9/02 (2013.01)

(58) Field of Classification Search
CPC ............ G01R 31/2608; G01R 31/2621; H02H 1/0007; H02H 3/08; H02H 9/02
USPC .......................................................... 361/57
See application file for complete search history.

(56) References Cited

U.S. PATENT DOCUMENTS

| | | | |
|---|---|---|---|
| 6,717,785 B2* | 4/2004 | Fukuda | H03K 17/0828 361/86 |
| 9,013,850 B2* | 4/2015 | Hiyama | H03K 17/0828 361/93.7 |
| 2008/0212247 A1* | 9/2008 | Lee | H03K 17/163 361/88 |
| 2012/0140370 A1* | 6/2012 | Chen | H02H 3/093 361/87 |
| 2012/0242376 A1* | 9/2012 | Ose | H03K 17/0828 327/109 |
| 2014/0192449 A1 | 7/2014 | Shimizu | |
| 2015/0171932 A1* | 6/2015 | Khandelwal | H03K 5/1536 455/41.1 |
| 2016/0124037 A1 | 5/2016 | Zhang et al. | |
| 2018/0234088 A1* | 8/2018 | Narayanasamy | H02H 7/20 |

* cited by examiner

Primary Examiner — Jared Fureman
Assistant Examiner — Lucy M Thomas
(74) Attorney, Agent, or Firm — Brake Hughes Bellermann LLP

(57) ABSTRACT

A circuit for detecting faults affecting a power transistor comprises a conditioning circuit, a first fault status circuit, and a fault signaling circuit. The power transistor is turned on and off by assertion and de-assertion, respectively, of an input signal. The conditioning circuit produces a conditioned gate voltage signal from a gate voltage of the power transistor. The first fault status circuit asserts a first fault indication when the conditioned gate voltage signal is greater than a first fault reference voltage during a first interval after the assertion of the input signal. The fault signaling circuit asserts a fault signal in response to the first fault indication being asserted, and de-asserting the fault signal in response to the input signal being de-asserted.

18 Claims, 5 Drawing Sheets

- - - At the OC condition
........ At the HSF condition
——— At the normal condition

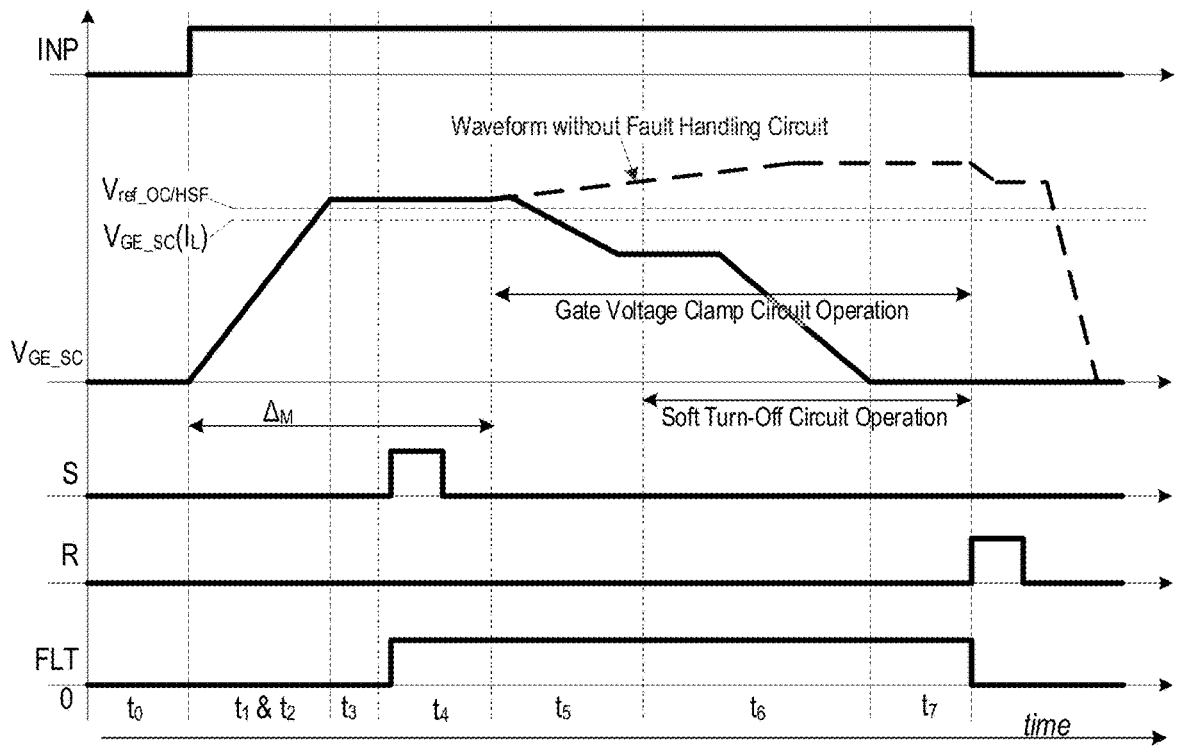
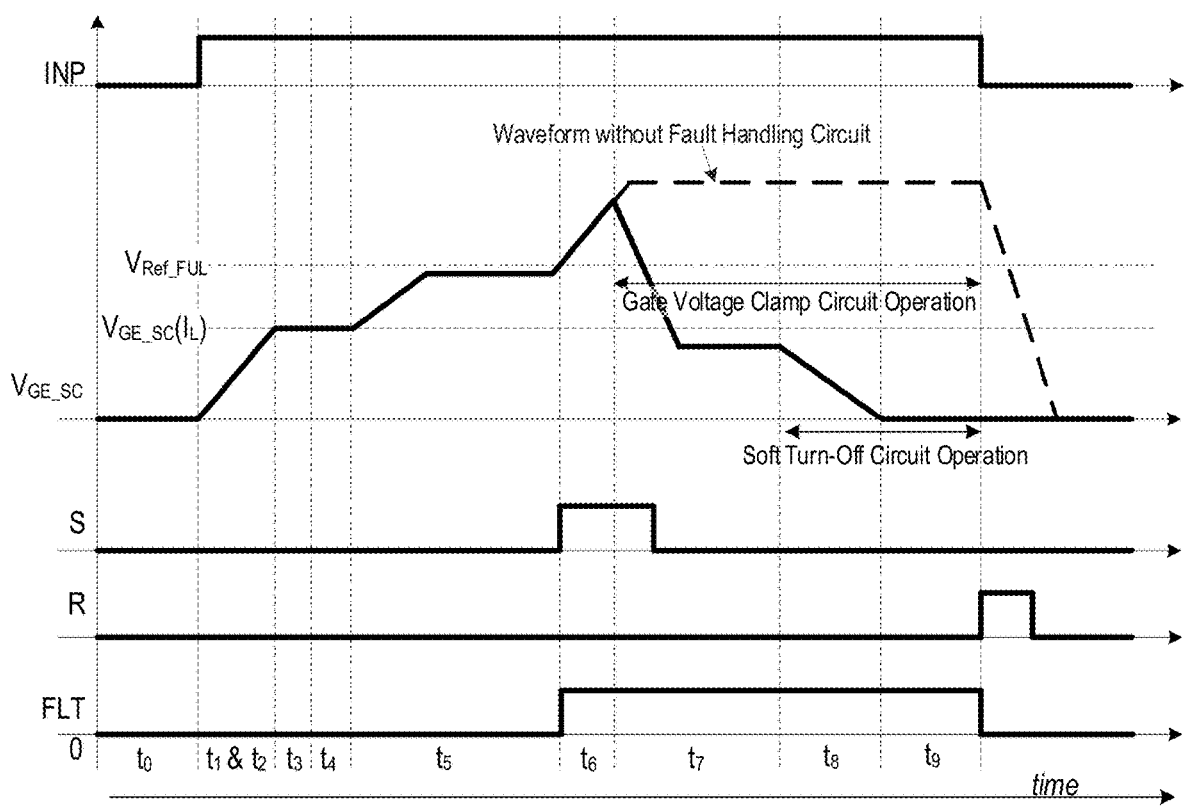

ns in cir-
IGBT/MOSFET FAULT PROTECTION

BACKGROUND

1. Field of the Invention

The present invention relates to a circuits and methods for protecting an Insulated Gate Bipolar Transistor (IGBT) or power Metal-Oxide-Semiconductor Field Effect Transistor (MOSFET) against faults such as a short-circuit fault, hard switching fault, and/or a fault-under-load.

2. Description of the Related Art

Devices for power control and/or power conversion (hereinafter, power control devices) may use a power transistor. It is possible to accomplish power control or conversion by switching on or off such a power transistor at predetermined intervals, such as by using Pulse Width Modulation (PWM), Pulse Frequency Modulation (PFM), or the like. The power transistor should be selected so as to reliably handle circuit currents not only under normal conditions but also under overload conditions. However, the power transistor may be affected by very high surge currents under fault conditions such as an Over-Current (OC) fault, a Hard Switching Fault (HSF), or a Fault-Under-Load (FUL).

An OC fault occurs when an excessive amount of current flows through the power transistor. An HSF may occur when another power transistor or a free-wheeling diode in the power control device is short-circuited at the time the power transistor is turned on. An FUL may occur when a short-circuit occurs in the load the power control device supplies power to.

Especially in the case when the power transistor is an Insulated Gate Bipolar Transistor (IGBT), but also for a power Metal-Oxide-Semiconductor Field Effect Transistor (MOSFET), currents many times higher than the rated level of the power transistor may flow through it when a serious fault condition occurs. Accordingly, to prevent high power loss and destruction of the power transistor by such fault currents, appropriate fault detection and correction must be performed quickly, such as within microseconds.

Driver ICs used to drive IGBTs and/or MOSFETs may support detection and response to fault situations. But these fault detection and response functions may require the use of additional signal inputs and additional components. Furthermore, the circuits used to detect the faults may incur time delays and additional power loss, and may make it difficult to determine the proper gate resistor(s) to use with a particular IGBT or MOSFET.

Accordingly, an IGBT/MOSFET driver capable of quickly detecting and responding to fault conditions without additional components and without wasting power is desirable.

SUMMARY

The present disclosure relates to fault detection and fault handling for power transistors, and in particular to circuits and methods for sensing fault conditions using a voltage of a gate signal of a power IGBT or power MOSFET.

BRIEF DESCRIPTION OF THE DRAWINGS

In the accompanying figures like reference numerals refer to identical or functionally similar elements throughout the separate views, together with the detailed description below, and are incorporated in and form part of the specification to further illustrate embodiments of concepts that include the claimed invention and explain various principles and advantages of those embodiments.

FIG. 12 illustrates operation of an embodiment when an over-current fault or hard switching fault occurs.

FIG. 13 illustrates operation of an embodiment when a fault-under-load occurs.

DETAILED DESCRIPTION

Figure 1:
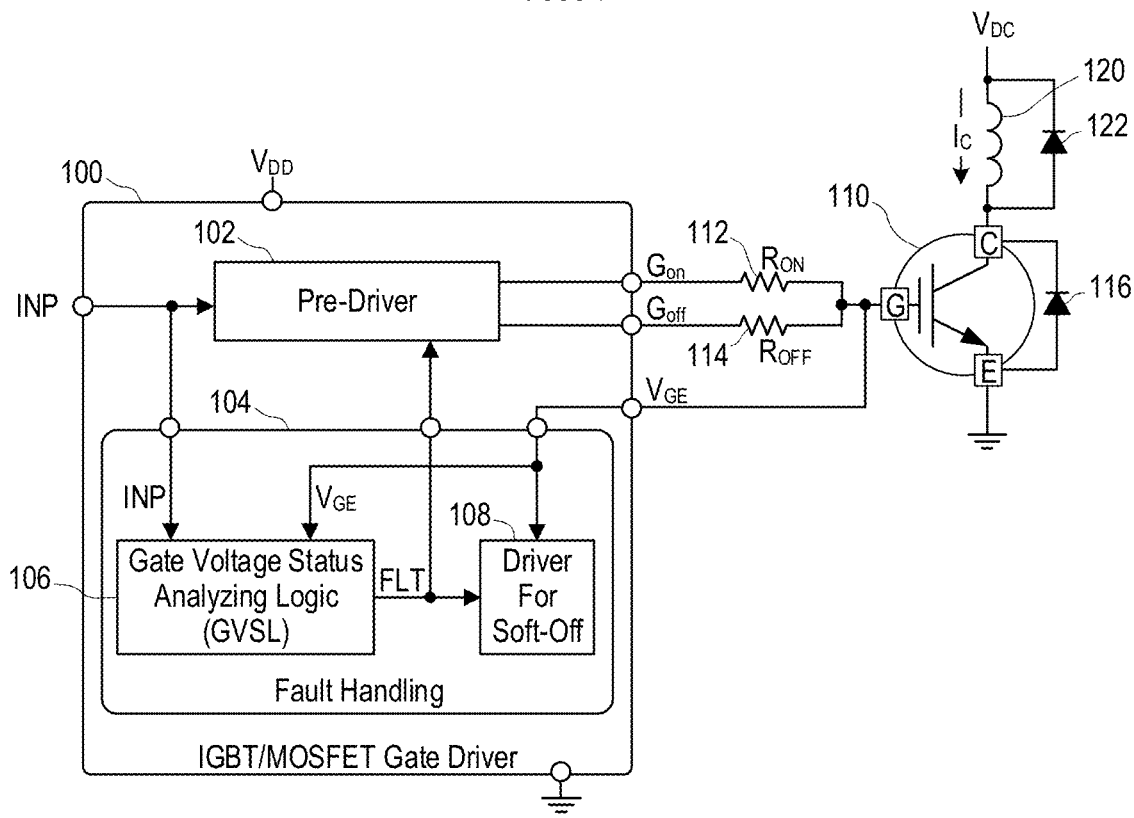
FIG. 1 illustrates a driver circuit according to an embodiment controlling an Insulated Gate Bipolar Transistor (IGBT).

Embodiments relate to detecting fault conditions in circuits using IGBTs or power MOSFETs.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative in nature and not restrictive. Like reference numerals designate like elements in the specification.

In the following, some components are disclosed as being bipolar junction transistors (BJTs), but embodiments are not limited thereto. Accordingly, a BJT in the examples may be replaced with a transistor of some other suitable kind (such as a FET), with a control input (such as a gate), a first conduction terminal (such as a source or drain), and a second conduction terminal (such as the other of the source or drain) of that transistor corresponding to a base, a collector, and an emitter of the BJT, respectively.

In an embodiment, a circuit is configured to detect faults. The circuit comprises a conditioning circuit, a first fault status circuit, and a fault signaling circuit. The conditioning circuit produces a conditioned gate voltage signal according to a gate voltage of a power transistor such as an IGBT or power MOSFET. The first fault status circuit produces a first fault indication by asserting the first fault indication when the conditioned gate voltage signal is greater than a first fault reference voltage during a first interval that begins at an assertion of an input signal. The fault signaling circuit produces a fault signal by asserting the fault signal in response the first fault indication being asserted and by de-asserting the fault signal in response to the input signal being de-asserted. Assertion of the input signal indicates that the power transistor is to be turned on, and de-assertion of the input signal indicates that the power transistor is to be turned off.

In an embodiment, a fault detection circuit included in a gate driver circuit detects fault conditions based on a gate voltage of a power IGBT or power MOSFET (hereinafter, a power transistor) controlled by the gate driver circuit, and an input signal that controls the turning on and off of the power transistor. The fault detection circuit may detect any or all of over-current faults, hard switching faults, faults under load, or combinations thereof. The fault detection circuit may use only the input signal and gate voltage (along with one or more internal reference voltages and one or more internal durations) to detect the faults. In particular, embodiments of the fault detection circuit do not need information regarding a gate current of the power transistor, a current through the power transistor, an input voltage to the power transistor, or an output voltage produced using the power transistor to detect the faults. Accordingly, a parts count of the circuit including the power transistor may be reduced and efficiency of that circuit may be improved by removing the need to monitor additional currents and/or voltages to provide fault protection. Furthermore, fault protection may be provided in situations where monitoring currents through the power transistor or output voltages produced using the power transistor is prohibitively difficult.

FIG. 1 illustrates a driver circuit 100 according to an embodiment controlling an IGBT 110 that controls power to an inductive load. In another embodiment, the driver circuit 100 may control a power Metal-Oxide-Semiconductor Field Effect Transistor (MOSFET).

The driver circuit 100 includes a pre-driver circuit 102 and a fault handling circuit 104. The driver circuit 100 receives an input signal INP from an outside source, monitors and, in some situations, controls a gate voltage $V_{GE}$ (more precisely, a gate-to-emitter voltage) of a gate G of the IGBT 110, and generally controls the IGBT 110 using a gate on signal $G_{on}$ to source current to the gate G of the IGBT 110 and a gate off signal $G_{off}$ to sink current from the gate G of the IGBT 110.

The pre-driver circuit 102 produces, using an input signal INP from an external source and a fault signal FLT produced by the fault handling circuit 104, the gate on signal $G_{on}$ and the gate off signal $G_{off}$.

In an embodiment, when the fault signal FLT is de-asserted (indicating that no fault has been detected), in response to the input signal INP indicating that the IGBT 110 is to be turned on, the pre-driver circuit 102 sources current to the gate on signal $G_{on}$ and floats the gate off signal $G_{off}$; and in response to the input signal INP indicating that the IGBT 110 is to be turned off, the pre-driver circuit 102 floats the gate on signal $G_{on}$ and sinks current into the gate off signal $G_{off}$. However, when the fault signal FLT is asserted (indicating that a fault has been detected) the pre-driver circuit 102 may float both the gate on signal $G_{on}$ and the gate off signal $G_{off}$.

The gate on signal $G_{on}$ is coupled to the gate G of the IGBT 110 by the on resistor 112. The on resister 112 controls a rate at which the IGBT 110 is turned on. The gate off signal $G_{off}$ is coupled to the gate G of the IGBT 110 by the off resistor 114. The off resister 114 controls a rate at which the IGBT 110 is turned off in non-fault situations.

In another embodiment, the driver circuit 100 and the pre-driver circuit 102 may produce a single gate on/off signal that sinks and sources current as described above. In another embodiment, a single resistor may control both the rate of turn on and the normal rate of turn off of the IGBT 110. In another embodiment, a single gate on/off signal may be coupled to the gate G of the IGBT 110 using two diodes and two resistors configured so that one of the two resistors controls the rate of turn on and the other the normal rate of turn off of the IGBT 110.

The fault handling circuit 104 detects faults using the input signal INP and the gate voltage $V_{GE}$ of the IGBT 110. In response to detecting a fault, the fault handling circuit 104 outputs a fault signal FLT to the pre-driver circuit 102 and controls the gate voltage $V_{GE}$ to safely turn off the IGBT 110. The fault handling circuit 104 includes a gate voltage status analyzing logic (GVSL) circuit 106 to produce the fault signal FLT using the input signal INP and the gate voltage $V_{GE}$, and a soft-off driver circuit 108 that controls the gate voltage $V_{GE}$ to safely turn off the IGBT 110 in response to the fault signal FLT being asserted.

The IGBT 110 has a collector C coupled to a first end of an inductor 120 and an emitter E coupled to ground. A second end of the inductor 120 is coupled to a DC power supply $V_{DC}$. A cathode of a freewheeling diode 122 is coupled to the second end of the inductor 120, and an anode of the freewheeling diode 122 is coupled to the first end of the inductor 120. A protection diode 116 has a cathode connected to the collector C of the IGBT 110 and an anode connected to the emitter E of the IGBT 110.

The inductor 120 may be an energy storage component of a power supply, a coil of an electromechanical device such as a motor or solenoid, or the like. The IGBT 110 controls a collector current $I_C$ through the inductor 110 by turning on and off.

Figure 2:
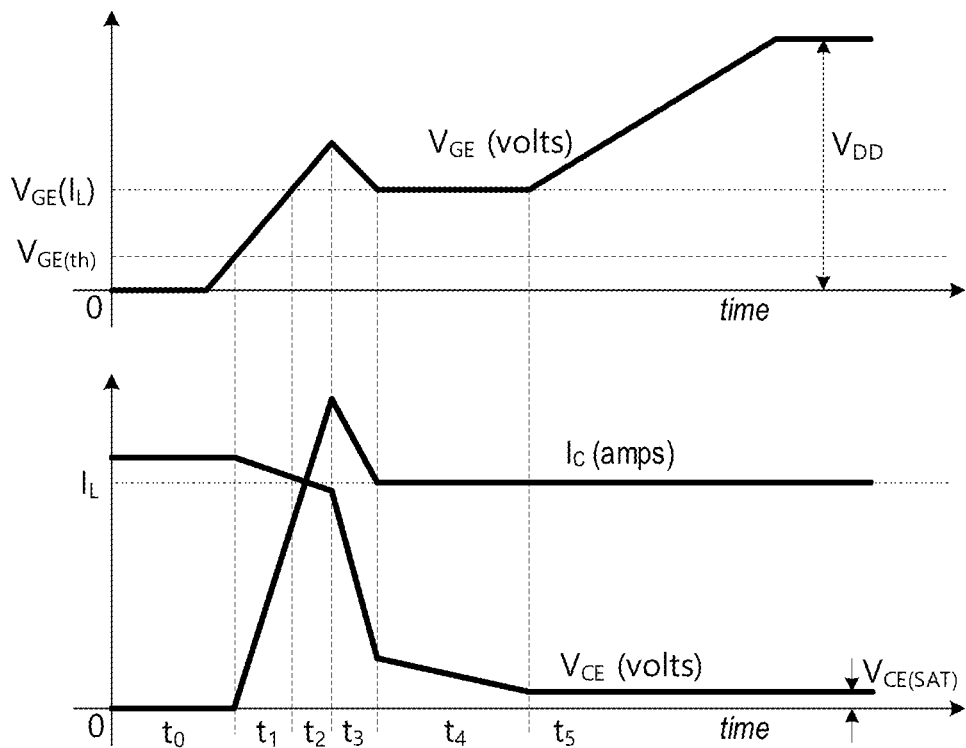
FIG. 2 illustrates voltages and currents of an IGBT being switched on under normal operating conditions.

FIG. 2 illustrates voltages and currents of an IGBT being switched on under normal operating conditions while driving an inductive load, such as the inductor 120 shown in FIG. 1. Herein, "normal operation" refers to operation of the circuit when a fault (such as an over-current fault, hard switching fault, or fault-under-load) is not affecting the operation of the IGBT. The waveforms illustrated include a gate voltage $V_{GE}$ (more precisely, a gate-to-emitter voltage) of the IGBT, a collector current $I_C$ being conducted from the collector to the emitter of the IGBT when the IGBT is on, and a collector-emitter voltage $V_{CE}$ across the collector and the emitter of the IGBT.

In a first time interval t0, the IGBT is off. The gate voltage $V_{GE}$ is initially zero but towards the end of the interval begins to rise until it reaches the gate threshold voltage $V_{GE(th)}$. During this interval the collector current $I_C$ and the collector-emitter voltage $V_{CE}$ do not change.

In a second time interval t1, the gate voltage $V_{GE}$ exceeds the gate threshold voltage $V_{GE(th)}$, which allows the collector current $I_C$ to start flowing. In the second time interval t1, the IGBT may be in an active phase and the collector current $I_C$ may increase according to the gate voltage $V_{GE}$. The collector current $I_C$ gradually increases to the full load current $I_L$. The collector-emitter voltage $V_{CE}$ decreases in proportion to a stray inductance of the IGBT and the collector current's time derivative, $\delta I_C/\delta t$.

In a third time intervals t2, the collector-emitter voltage $V_{CE}$ continues to decrease in proportion to the stray inductance of the IGBT and the collector current's time derivative, $\delta I_C/\delta t$. The collector current $I_C$ continues increasing according to the reverse recovery current of a free-wheeling diode, such as the freewheeling diode 122 of FIG. 1. The reverse recovery current of the free-wheeling diode starts flowing in the third time interval t2, increasing over the third time interval t2. Accordingly, the gate voltage $V_{GE}$ rises during the third time interval t2.

The reverse recovery current of the free-wheeling diode starts decreasing during the fourth time interval t3. In this same fourth time interval t3, the voltage across the free-wheeling diode can increase, and the collector-emitter voltage $V_{CE}$ can drop. If the gate-collector collector capacitance $C_{GC}$ of the IGBT is low and the DC voltage $V_{DC}$ being provided to the inductive load is high enough, the collector-emitter voltage $V_{CE}$ can decrease sharply.

During the fourth time interval t3, the gate-collector capacitance $C_{GC}$ of the IGBT and the gate-emitter capacitance $C_{GE}$ of the IGBT may discharge. The reverse recovery of the freewheeling diode terminates at the end of the fourth time interval t3.

In a fifth time interval t4, the gate current $I_G$ being provided to the gate of the IGBT charges the gate-emitter capacitance $C_{GE}$ of the IGBT. The gate voltage $V_{GE}$ may substantially remain at the full load gate voltage $V_{GE}(I_L)$, and the collector current $I_C$ may substantially remain at the full load current $I_L$; because the gate voltage $V_{GE}$ stays at the same value during this period, this period may be called the Miller plateau. However, the collector-emitter voltage $V_{CE}$ may drop with a ratio of $(V_{DD}-V_{GE}(I_L))/(R_G C_{GC})$, where $R_G$ is the resistance controlling the current being provided to the gate and $V_{DD}$ is a maximum gate voltage. In embodiments, the maximum gate voltage $V_{DD}$ is a maximum voltage that can be output by a pre-driver circuit coupled to the gate of the IGBT, such as the pre-driver circuit 102 of FIG. 1.

In a sixth time interval t5, the gate voltage $V_{GE}$ can increase with a time constant $Rg(C_{GE}+C_{GC,miller})$, where $C_{GC,miller}$ is a Miller capacitance of the IGBT, until the gate voltage $V_{GE}$ reaches the maximum gate voltage $V_{DD}$. In the sixth time interval t5, the collector-emitter voltage $V_{CE}$ gradually decreases until it reaches the saturation voltage $V_{CE(SAT)}$.

Figure 3:
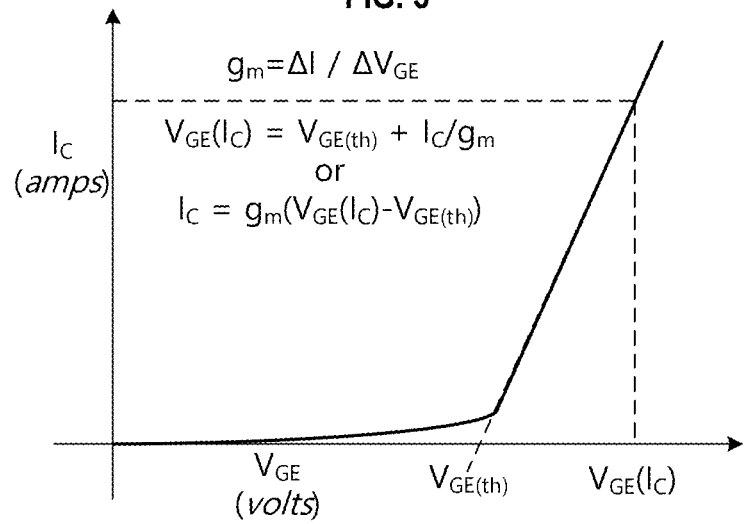
FIG. 3 illustrates transfer characteristics of an IGBT or MOSFET.

FIG. 3 illustrates transfer characteristics of an IGBT or MOSFET. The figure illustrates the relationships between the transconductance $g_m$ of the IGBT or MOSFET, the gate voltage $V_{GE}$ of the IGBT or MOSFET, and the collector current $I_C$ of the IGBT or MOSFET.

As shown in FIG. 3, the gate voltage $V_{GE}$ when the IGBT or MOSFET is turned on may be determined as the sum of the gate threshold voltage $V_{GE(th)}$ and the collector current $I_C$ divided by the transconductance $g_m$. Accordingly, if the full load current $I_L$ is known, the gate voltage $V_{GE}$ during the fifth time interval t4 of FIG. 2, known hereinafter as the Miller voltage, may be determined by dividing the full load current $I_L$ by the transconductance $g_m$ and adding the gate threshold voltage $V_{GE(th)}$.

Figure 4:
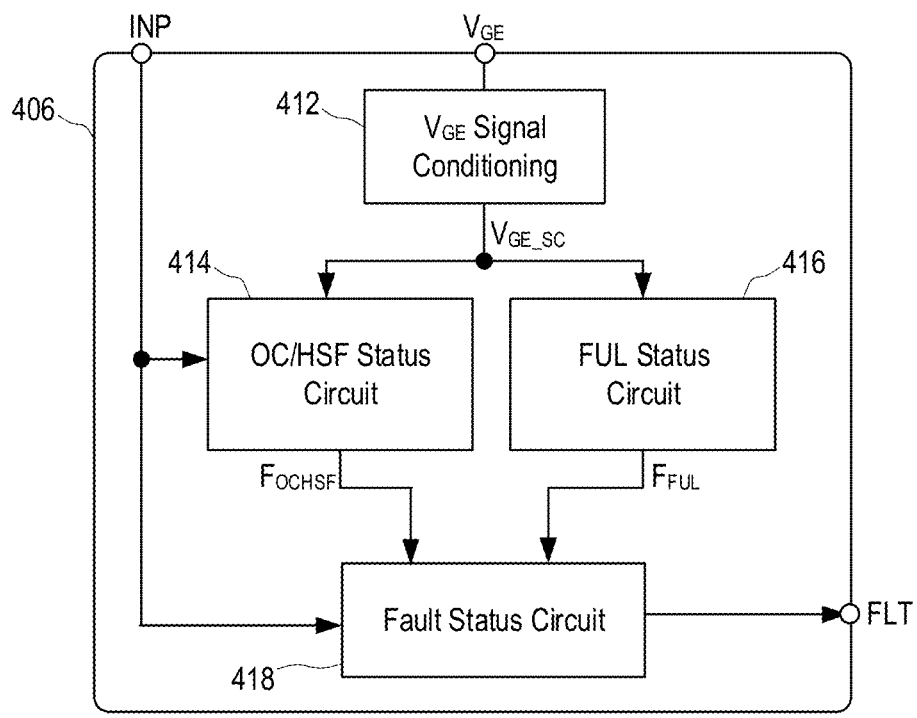
FIG. 4 illustrates a gate voltage status analyzing logic circuit according to an embodiment.

FIG. 4 illustrates a gate voltage status analyzing logic (GVSL) circuit 406 according to an embodiment. The GVSL circuit 406 receives an input signal INP and a gate voltage $V_{GE}$, and produces a fault signal FLT. The input signal INP may be asserted to indicate that the IGBT is to be turned on, and de-asserted to indicate that the IGBT is to be turned off. The fault signal FLT may be asserted to indicate that a fault has occurred, and de-asserted otherwise. The GVSL circuit 406 may be included in the GVSL circuit 106 of FIG. 1.

The GVSL circuit 406 includes a signal conditioning circuit 412, an Over-Current/Hard Switching Fault (OC/HSF) status circuit 414, a Fault-under-Load (FUL) status circuit 416, and a fault status circuit 418. The fault status circuit 418 may be referred to as a fault signaling circuit.

The signal conditioning circuit 412 receives the gate voltage $V_{GE}$ and produces a conditioned gate voltage $V_{GE\_SC}$. In embodiments, the signal conditioning circuit 412 may produce the conditioned gate voltage $V_{GE\_SC}$ by limiting, reducing and/or shifting a voltage range of the gate voltage $V_{GE}$ and by filtering the gate voltage $V_{GE}$ to, for example, attenuate noise and transients on the gate voltage $V_{GE}$.

The OC/HSF status circuit 414 receives the input signal INP and the conditioned gate voltage $V_{GE\_SC}$ and produces an OC/HSF fault signal $F_{OCHSF}$. In embodiments, the OC/HSF status circuit 414 generates the OC/HSF fault signal $F_{OCHSF}$ according to a magnitude of the conditioned gate voltage $V_{GE\_SC}$ during the Miller plateau.

The FUL status circuit 416 receives the conditioned gate voltage $V_{GE\_SC}$ and produces a FUL fault signal $F_{FUL}$. In embodiments, the FUL status circuit 416 produces the FUL fault signal $F_{FUL}$ by comparing the conditioned gate voltage $V_{GE\_SC}$ to a predetermined threshold voltage corresponding to the maximum gate voltage $V_{DD}$.

The fault status circuit 418 receives the input signal INP, the OC/HSF fault signal $F_{OCHSF}$, and the FUL fault signal $F_{FUL}$, and produces the fault signal FLT. In an embodiment, the fault status circuit 418 de-asserts the fault signal FLT in response to the input signal INP being de-asserted, and asserts the fault signal FLT in response to an assertion of either or both of the OC/HSF fault signal $F_{OCHSF}$ and the FUL fault signal $F_{FUL}$ being asserted.

Notably, the GVSL circuit 406 detects the OC/HSF and FUL conditions without using information on the gate current flowing to the IGBT or power MOSFET being controlled, and without using information on the current flowing through the IGBT or power MOSFET (that is, without needing to measure the collector-emitter current of the IGBT or the drain-source current of the power MOSFET).

Figure 5:
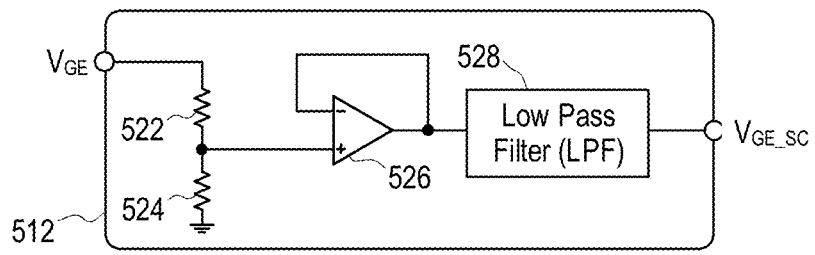
FIG. 5 illustrates a gate voltage signal conditioning circuit according to an embodiment.

FIG. 5 illustrates a signal conditioning circuit 512 according to an embodiment. The signal conditioning circuit 512 produces a conditioned gate voltage $V_{GE\_SC}$ according to a gate voltage $V_{GE}$, and includes a voltage divider formed by a first resistor 522 and a second resistor 524, an operational amplifier 526, and a low pass filter circuit 528. The signal conditioning circuit 512 may be included in the signal conditioning circuit 412 of FIG. 4.

The gate voltage $V_{GE}$ is provided to the voltage divider, and the output of the voltage divider is provided to the positive input of the operational amplifier 526. Accordingly, the voltage at the positive input of the operational amplifier 526 is equal to $V_{GE} \times R_{524}/(R_{524}+R_{522})$, where $R_{522}$ is the resistance of the first resistor 522 and $R_{524}$ is the resistance of the first resistor 524.

The operational amplifier 526 is configured as a unity-gain amplifier, and accordingly an output of the operational amplifier 526 is equal to the signal at the positive input of the operational amplifier 526, that is, to $V_{GE} \times R_{524}/(R_{524}+R_{522})$. However, embodiments are not limited thereto, and in embodiments, the operational amplifier 526 may be configured to provide gain less than one or greater than one.

The low pass filter 528 produces the conditioned gate voltage $V_{GE\_SC}$ by low-pass filtering the output of the operational amplifier 526. In an embodiment, a time constant of the low pass filter 528 is 40 nanoseconds.

Figure 6:
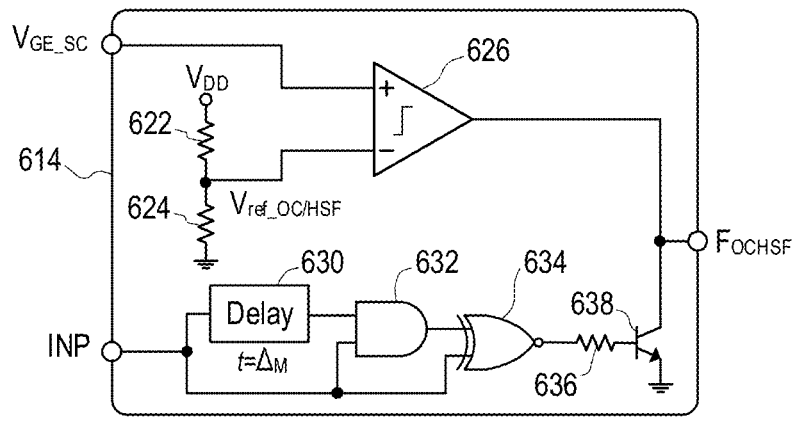
FIG. 6 illustrates an over-current and hard switching fault status circuit according to an embodiment.

FIG. 6 illustrates an over-current and hard switching fault (OC/HSF) status circuit 614 according to an embodiment. The OC/HSF status circuit 614 produces an OC/HSF fault signal $F_{OCHSF}$ according to the input signal INP and the conditioned gate voltage $V_{GE\_SC}$. The OC/HSF status circuit 614 may be included in the OC/HSF status circuit 414 of FIG. 4.

The OC/HSF status circuit 614 includes a voltage divider comprising a first resistor 622 and a second resistor 642, a comparator 626, a delay circuit 630, an AND gate 632, an Exclusive-NOR (XNOR) gate 634, a third resistor 638, and a transistor 638.

The voltage divider including the first and second resistors 622 and 624 produces an OC/HSF reference voltage $V_{ref\_OC/HSF}$ by dividing a supply voltage $V_{DD}$. In an embodiment, the OC/HSF reference voltage $V_{ref\_OC/HSF}$ corresponds to voltage higher than a value of the conditioned gate voltage $V_{GE\_SC}$ that would be produced by the signal conditioning circuit 512 when the gate voltage $V_{GE}$ has a value equal to a Miller voltage of the IGBT or MOSFET.

In an embodiment, the value of the OC/HSF reference voltage Vref_OC/HSF is a predetermined fraction of the supply voltage $V_{DD}$. In another embodiment, one or more of the first and second resistors 622 and 624 may be external resistors chosen to set the value of the OC/HSF reference voltage Vref_OC/HSF. In another embodiment, one or more of the first and second resistors 622 and 624 may be a programmable variable resistor than can be programmed to set the OC/HSF reference voltage Vref_OC/HSF. Although FIG. 6 discloses generating the OC/HSF reference voltage $V_{ref\_OC/HSF}$ using a resistive voltage divider, embodiments are not limited thereto.

The comparator 626 compares the OC/HSF reference voltage $V_{ref\_OC/HSF}$ to the conditioned gate voltage $V_{GE\_SC}$ and attempts to assert the OC/HSF fault signal $F_{OCHSF}$ when the conditioned gate voltage $V_{GE\_SC}$ greater than the OC/HSF reference voltage $V_{ref\_OC/HSF}$. However, the comparator 626 will be unable to assert the OC/HSF fault signal $F_{OCHSF}$ while the transistor 638 is turned on.

The transistor 638 is controlled by the delay circuit 630, the AND gate 632, and the XNOR gate 634, which operate to turn the transistor 638 off (allowing the OC/HSF fault signal $F_{OCHSF}$ to be asserted) for the period corresponding to the delay time t of the delay circuit 630 immediately after the input signal INP is asserted, and to turn the transistor 638 back on after the delay time of the delay circuit 630 has elapsed after the input signal INP was asserted. In an embodiment, the delay time t of the delay circuit 630 is a time $\Delta_M$ corresponding to the expected delay between the assertion of the input signal INP and the end of the Miller plateau, such as shown in the fifth interval t4 of FIG. 2.

The delay time of the delay circuit 630 may be selected so that the transistor 638 is turned off before and during the Miller plateau (the fifth time t4 of FIG. 2), and is turned back on after the end of the Miller plateau, so that the OC/HSF fault signal $F_{OCHSF}$ can only be asserted when the conditioned gate voltage $V_{GE\_SC}$ rises above the OC/HSF reference voltage $V_{ref\_OC/HSF}$ before or during the Miller plateau. In an embodiment, the OC/HSF reference voltage $V_{ref\_OC/HSF}$ is set higher than an expected value of the conditioned gate voltage $V_{GE\_SC}$ at the peak in the gate voltage $V_{GE}$ shown in FIG. 2 between t2 and t3. In another embodiment, the low pass filter 528 eliminates or substantially attenuates the effect of the peak in the gate voltage $V_{GE}$ shown in FIG. 2 between t2 and t3 on the conditioned gate voltage $V_{GE\_SC}$.

Figure 7:
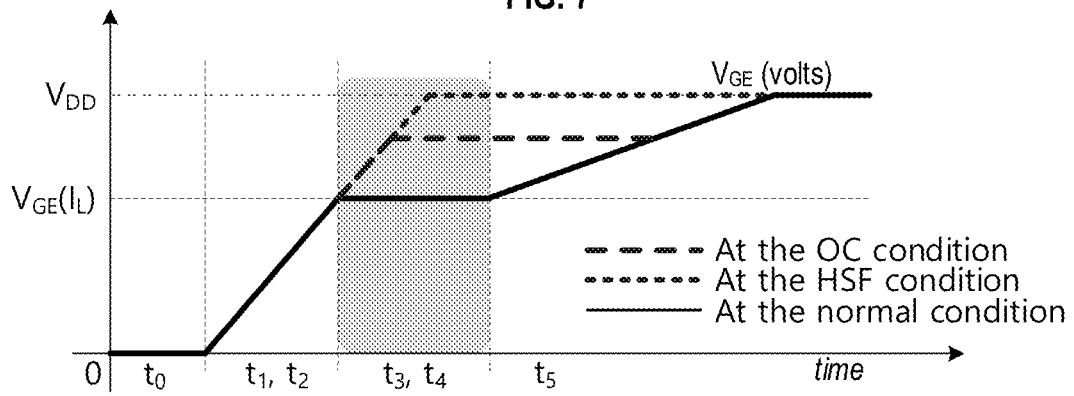
FIG. 7 illustrates a gate voltage of an IGBT during turn-on when an over-current fault or a hard switching fault occurs.

FIG. 7 illustrates a gate voltage of an IGBT (or MOSFET) during turn-on when an over-current fault or a hard-switching fault occurs, and will be used to explain operation of an OC/HSF status circuit according to an embodiment, such as the OC/HSF status circuit 614 of FIG. 6. In FIG. 7, the slight bump in the gate voltage $V_{GE}$ that may occur before the Miller plateau (as shown in FIG. 2) has been omitted to focus attention on the behavior of the gate voltage $V_{GE}$ during the interval t3,t4 that normally corresponds to the Miller plateau.

As shown in FIG. 7, when a circuit such as that shown in FIG. 1 is operating normally, the gate voltage $V_{GE}$ during the interval t3,t4 will be the Miller voltage $V_{GE}(I_L)$, as previously discussed. Accordingly, if the OC/HSF reference voltage $V_{ref\_OC/HSF}$ of FIG. 6 is configured to be higher than the value of conditioned gate voltage $V_{GE\_SC}$ when the gate voltage $V_{GE}$ is equal to the Miller voltage $V_{GE}(I_L)$, the comparator 626 will not assert the OC/HSF fault signal $F_{OCHSF}$ during the interval t3,t4 when the circuit is operating normally. Accordingly, if the delay value of the delay circuit 630 is configured to prevent assertion of the OC/HSF fault signal $F_{OCHSF}$ after the interval t3,t4, the OC/HSF fault signal $F_{OCHSF}$ will not be asserted during normal operation.

However, when the circuit such as that shown in FIG. 1 experiences an over-current condition or a hard switching fault condition, the gate voltage $V_{GE}$ may rise to be substantially above the Miller voltage $V_{GE}(I_L)$ during the interval t3,t4. Accordingly, if the OC/HSF reference voltage $V_{ref\_OC/HSF}$ is configured to be higher than the value of conditioned gate voltage $V_{GE\_SC}$ when the gate voltage $V_{GE}$ is equal to the Miller voltage $V_{GE}(I_L)$ but lower than the value of conditioned gate voltage $V_{GE\_SC}$ when the over-current condition or hard switching fault condition occur, the OC/HSF fault signal $F_{OCHSF}$ will be asserted during the interval t3,t4 in response to the over-current or hard switching fault.

Figure 8:
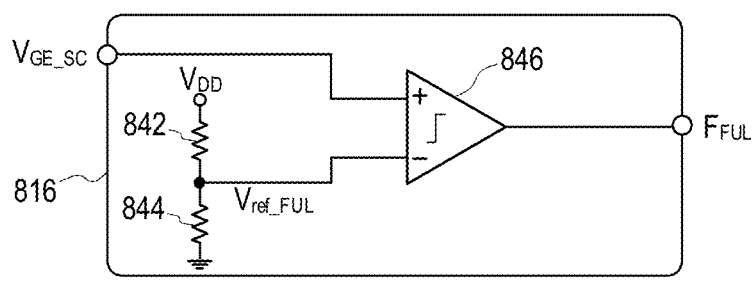
FIG. 8 illustrates a fault-under-load status circuit according to an embodiment.

FIG. 8 illustrates a fault-under-load (FUL) status circuit 816 according to an embodiment. The FUL status circuit 816 produces a FUL fault signal $F_{FUL}$ using a conditioned gate voltage $V_{GE\_SC}$, and includes a comparator 846 and voltage divider comprising a first resistor 842 and a second resistor 844. The FUL status circuit 816 may be included in the FUL status circuit 416 of FIG. 4.

The voltage divider comprising first and second resistors 842 and 844 operates to produce a FUL reference voltage $V_{ref\_FUL}$ by dividing a supply voltage $V_{DD}$. In an embodiment, the FUL reference voltage $V_{ref\_FUL}$ corresponds to voltage higher than a value of the conditioned gate voltage $V_{GE\_SC}$ that would be produced by the signal conditioning circuit 512 when the gate voltage $V_{GE}$ is equal to a maximum voltage $V_{DD}$ that a pre-driver can provide to a gate of an IGBT or MOSFET.

In an embodiment, the value of the FUL reference voltage $V9_{ref\_FUL}$ is a predetermined fraction of the supply voltage VDD. In another embodiment, one or more of the first and second resistors 842 and 844 may be external resistors chosen to set the value of the FUL reference voltage $V_{ref\_FUL}$. In another embodiment, one or more of the first and second resistors 842 and 844 may be a programmable variable resistor than can be programmed to set the FUL reference voltage $V_{ref\_FUL}$. And although FIG. 8 discloses generating the FUL reference voltage $V_{ref\_FUL}$ using a resistive voltage divider, embodiments are not limited thereto.

Figure 9:
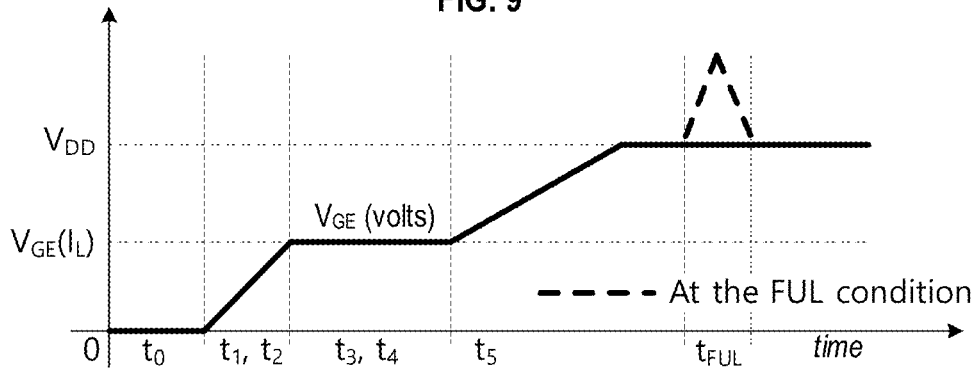
FIG. 9 illustrates a gate voltage of an IGBT when a fault-under-load occurs.

FIG. 9 illustrates a gate voltage of an IGBT (or MOSFET) when a fault-under-load (FUL) occurs, and will be used to explain operation of a FUL status circuit according to an embodiment, such as the FUL status circuit 816 of FIG. 8.

In intervals t0, t1, t2, t3, t4, t5, the IGBT operates normally as described for the corresponding intervals t0 to t5 of FIG. 2.

In interval $t_{FUL}$, a fault-under load (FUL) occurs. The FUL corresponds to a short-circuit that occurred after the IGBT was turned on. As a result, the collector current $I_C$ may increase sharply and the IGBT may leave a saturated mode and enter an active mode. Accordingly, the collector-emitter voltage $V_{CE}$ of the IGBT may increase and collector current $I_C$ may flow into the Miller capacitance $C_{GC,miller}$ of the IGBT. This may cause the gate voltage $V_{GE}$ to rise, and in particular may cause the gate voltage $V_{GE}$ to rise above the maximum voltage (here, supply voltage $V_{DD}$) that a pre-driver is able to provide to the gate of the IGBT, as shown by the dashed line in interval $t_{FUL}$ (where the solid line shows what the gate voltage $V_{GE}$ would be in the absence of the FUL).

Referring to FIG. 8, when the gate voltage $V_{GE}$ rises above supply voltage VDD during the FUL interval $t_{FUL}$, the conditioned gate voltage $V_{GE\_SC}$ rises above the FUL reference voltage $V_{ref\_FUL}$, and as a result the comparator 846 asserts the FUL fault signal $F_{FUL}$ to indicate that the FUL is occurring.

Figure 10:
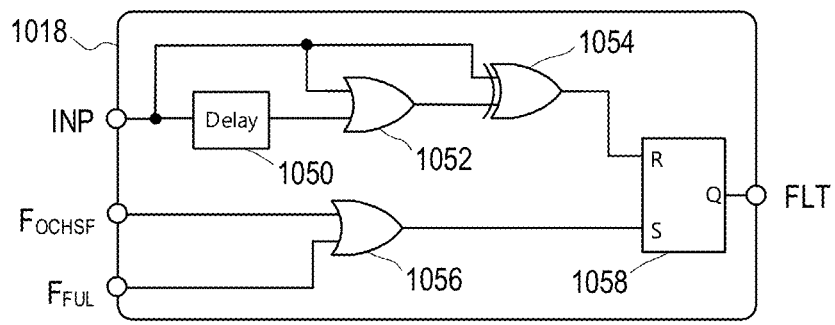
FIG. 10 illustrates a fault status circuit according to an embodiment.

FIG. 10 illustrates a fault status circuit 1018 according to an embodiment. The fault status circuit 1018 produces the fault signal FLT according to the OC/HSF fault signal $F_{OCHSF}$, the FUL fault signal $F_{FUL}$, and the input signal INP. The fault status circuit 1018 may be included in the fault status circuit 418 of FIG. 4.

The fault status circuit 1018 includes a delay circuit 1050, a first OR gate 1052, an Exclusive-OR (XOR) gate 1054, a second OR gate 1056, and a Set-Reset Flip-Flop (SRFF) 1058.

The delay circuit 1050, first OR gate 1052, and XOR gate 1054 operate as a negative-edge triggered pulse generator that produce a pulse on an output of the XOR gate 1054 in response to the input signal INP being de-asserted. The pulse on the output of the XOR gate is provided to a reset input R of the SRFF 1058 and has a duration equal to the delay of the delay circuit 1050. In an embodiment, the duration of the pulse corresponds to a minimum pulse width that will be recognized by the reset input R of the SRFF 1058.

The second OR gate 1056 receives the OC/HSF fault signal $F_{OCHSF}$ and the FUL fault signal $F_{FUL}$ and produces an output that is asserted (i.e., has a logical 1 value) when one or both of the OC/HSF fault signal $F_{OCHSF}$ and the FUL fault signal $F_{FUL}$ are asserted, and is de-asserted (i.e., has a logical 1 value) otherwise. The output of the second OR gate 1056 is provided to a set input S of the SRFF 1058.

The fault signal FLT is generated at an output Q of the SRFF 1058 by de-asserting the fault signal FLT in response to the input signal INP being de-asserted, and asserting the fault signal FLT when one or both of the OC/HSF fault signal $F_{OCHSF}$ and the FUL fault signal $F_{FUL}$ are asserted.

Figure 11:
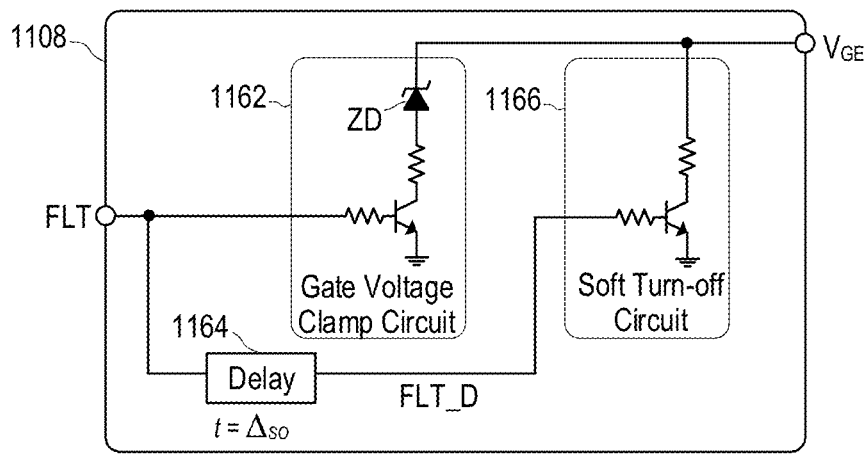
FIG. 11 illustrates a gate voltage clamp and soft-off driver circuit for use in an embodiment.

FIG. 11 illustrates a soft-off driver circuit 1108 for use in an embodiment. The soft-off driver circuit 1108 controls a gate voltage $V_{GE}$ in response to a fault signal FLT being asserted. The soft-off driver circuit 1108 may be included in the soft-off driver circuit 108 of FIG. 1.

The soft-off driver circuit 1108 includes a gate voltage clamp circuit 1162, a delay circuit 1164, and a soft turn-off circuit 1166.

The gate voltage clamp circuit 1162 operates to pull the gate voltage $V_{GE}$ down to a reverse breakdown voltage of a Zener diode ZD at a predetermined rate when the fault signal FLT is asserted, and does not affect the gate voltage $V_{GE}$ when the fault signal FLT is de-asserted.

The delay circuit 1164 produces a delayed fault signal FLT_D by delaying the fault signal FLT by a predetermined soft off delay time ΔSO. In an illustrative embodiment, the soft off delay time ΔSO may be 1.2 μs.

The soft turn-off circuit 1166 operates to pull the gate voltage $V_{GE}$ down to ground at a predetermined rate when the delayed fault signal FLT_D is asserted, and does not affect the gate voltage $V_{GE}$ when the delayed fault signal FLT_D is not asserted.

FIG. 12 illustrates operation of an embodiment when an over-current fault or hard switching fault occurs. FIG. 12 shows waveforms for the input signal INP which is a logic value (asserted when high and de-asserted when low), the conditioned gate voltage $V_{GE\_SC}$ in volts, the set input S and reset input R of the SRFF 1058 of FIG. 10 which are logic values, and the fault signal FLT which is a logic value.

In a first interval t0, the input signal INP is de-asserted and as a result the gate voltage $V_{GE}$ is low (here, 0V), turning the IGBT (or MOSFET) off. Because the gate voltage $V_{GE}$ is 0V, the conditioned gate voltage $V_{GE\_SC}$ is also 0V.

At the beginning of a second interval $t_1$, the input signal INP is asserted, and as a result the gate voltage $V_{GE}$ and the conditioned gate voltage $V_{GE\_SC}$ begin to rise. The conditioned gate voltage $V_{GE\_SC}$ continues to rise through the third interval t2, eventually rising above the full load conditioned gate voltage $V_{GE\_SC}(I_L)$, which is the value of the conditioned gate voltage $V_{GE\_SC}$ when the gate voltage $V_{GE}$ is at the full load gate voltage $V_{GE}(I_L)$.

During the fourth interval t3, when the gate voltage $V_{GE}$ would normally fall to the full load gate voltage $V_{GE}(I_L)$ as shown in FIG. 2, the gate voltage $V_{GE}$ remains higher than the full load gate voltage $V_{GE}(I_L)$ and as a result the conditioned gate voltage $V_{GE\_SC}$ remains higher than the full load conditioned gate voltage $V9_{GE\_SC}(I_L)$.

During the fifth interval t4, when the gate voltage $V_{GE}$ would normally enter the Miller plateau at a voltage equal to the full load gate voltage $V_{GE}(I_L)$, the gate voltage $V_{GE}$ remains higher than the full load gate voltage $V_{GE}(I_L)$ and as a result the conditioned gate voltage $V_{GE\_SC}$ remains higher than the full load conditioned gate voltage $V_{GE\_SC}(I_L)$.

For a delay of a time $\Delta_M$ corresponding to the expected delay between the assertion of the input signal INP and the end of the Miller plateau, the embodiment enables detection of the over-current fault or hard switching fault. For example, in the embodiment shown as the OC/HSF status circuit 614 in FIG. 6, detection of over-current faults or hard switching faults is enabled by turning off the transistor 638 during the delay of a time $\Delta_M$ after assertion of the input signal INP, allowing the output of comparator 626 to rise when the conditioned gate voltage $V_{GE\_SC}$ is greater than the OC/HSF reference voltage $V_{ref\_OC/HSF}$. As shown in FIG. 12, the OC/HSF reference voltage $V_{ref\_OC/HSF}$ is configured to be higher than the full load conditioned gate voltage $V_{GE\_SC}(I_L)$.

Because the conditioned gate voltage $V_{GE\_SC}$ is greater than the OC/HSF reference voltage $V_{ref\_OC/HSF}$ while the transistor 638 is turned off, the OC/HSF fault signal $F_{OCHSF}$ is asserted, causing the set input S of the SRFF 1058 of FIG. 10 to be asserted. This causes the fault signal FLT to be asserted during the fifth interval t4.

In response to the assertion of the fault signal FLT, in a sixth interval t5 the pre-driver circuit 102 of FIG. 1 stops driving the gate on signal $G_{ON}$, and the gate voltage clamp circuit 1162 activates. The gate voltage clamp circuit 1162 discharges the gate capacitance of the IGBT (or MOSFET) until the gate voltage $V_{GE}$ reaches a predetermined clamp voltage (here, the breakdown voltage of the Zener diode ZD in the gate voltage clamp circuit 1162.) As shown in FIG. 12, the conditioned gate voltage $V_{GE\_SC}$ declines as a result of the gate voltage $V_{GE}$ declining.

In a seventh interval t6 beginning a soft-off delay time after the assertion of the fault signal FLT, a soft turn-off circuit 1166 activates and discharges the gate capacitance of the IGBT (or MOSFET) until the gate voltage $V_{GE}$ reaches 0V, with the conditioned gate voltage $V_{GE\_SC}$ declining accordingly. When the gate voltage $V_{GE}$ reaches 0V, the IGBT (or MOSFET) is turned off.

The IGBT (or MOSFET) remains turned off until the end of the eighth interval t7, which ends when the input signal INP is de-asserted. In response to the input signal INP being de-asserted, the OC/HSF fault signal $F_{OCHSF}$ and the fault signal FLT are de-asserted. The fault signal FLT being de-asserted causes the gate voltage clamp circuit 1162 and the soft turn-off circuit 1166 to be turned off, and enables the pre-driver circuit 102 of FIG. 1 to drive the gate on signal $G_{ON}$ the next time the input signal INP is asserted.

In this manner, the embodiment protects against over-current and hard switching faults by detecting that the gate voltage $V_{GE}$ is too high during the time that normally corresponds to the Miller plateau, and safely turning off the IGBT (or MOSFET) in response.

FIG. 13 illustrates operation of an embodiment when a fault-under-load occurs. FIG. 13 shows waveforms for the input signal INP which is a logic value, the conditioned gate voltage $V_{GE\_SC}$ in volts, the set input S and reset input R of the SRFF 1058 of FIG. 10 which are logic values, and the fault signal FLT which is a logic value.

Operation of the embodiment is normal, as described FIG. 2, for the first to sixth intervals t0 to t5.

In the seventh interval t6, a fault-under-load occurs. As a result, the gate voltage $V_{GE}$ rises above the (normal) maximum gate voltage $V_{DD}$ shown in FIG. 2, and therefore the conditioned gate voltage $V_{GE\_SC}$ rises above the FUL reference voltage $V_{ref\_FUL}$.

In response to the conditioned gate voltage $V_{GE\_SC}$ rising above the FUL reference voltage $V_{ref\_FUL}$, the FUL fault signal $F_{FUL}$ is asserted by the full status circuit 816, which causes the set input S of the SRFF 1058 of FIG. 10 to be asserted. This causes the fault signal FLT to be asserted during the fifth interval seventh interval t6.

In response to the assertion of the fault signal FLT, in the seventh interval t6 the pre-driver circuit 102 of FIG. 1 stops driving the gate on signal $G_{ON}$, and the gate voltage clamp circuit 1162 activates. In an eighth interval t7, the gate voltage clamp circuit 1162 discharges the gate capacitance of the IGBT (or MOSFET) until the gate voltage $V_{GE}$ reaches a predetermined clamp voltage (here, the breakdown voltage of the Zener diode ZD in the gate voltage clamp circuit 1162.) As shown in FIG. 13, the conditioned gate voltage $V_{GE\_SC}$ declines as the gate voltage $V_{GE}$ does.

In a ninth interval t8 beginning a soft-off delay time after the assertion of the fault signal FLT, a soft turn-off circuit 1166 activates and discharges the gate capacitance of the IGBT (or MOSFET) until the gate voltage $V_{GE}$ reaches 0V, with the conditioned gate voltage $V_{GE\_SC}$ declining accordingly. When the gate voltage $V_{GE}$ reaches 0V, the IGBT (or MOSFET) is turned off.

The IGBT (or MOSFET) remains turned off until the end of the tenth interval t9, which ends when the input signal INP is de-asserted. In response to the input signal INP being de-asserted, the OC/HSF fault signal $F_{OCHSF}$ and the fault signal FLT are de-asserted. The fault signal FLT being de-asserted causes the gate voltage clamp circuit 1162 and the soft turn-off circuit 1166 to be turned off, and enables the pre-driver circuit 102 of FIG. 1 to drive the gate on signal $G_{ON}$ the next time the input signal INP is asserted.

In this manner, the embodiment protects against Fault-under-Load faults by detecting that the gate voltage $V_{GE}$ is higher than the maximum normal gate voltage and safely turning off the IGBT (or MOSFET) in response.

Embodiments of the present disclosure include electronic devices, e.g., one or more packaged semiconductor devices, configured to perform one or more of the operations described herein. However, embodiments are not limited thereto.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined.

What is claimed is:

1. A circuit configured to detect faults, the circuit comprising:
   a conditioning circuit configured to produce a conditioned gate voltage signal according to a gate voltage of a power transistor by;
      voltage dividing a gate voltage signal indicating the gate voltage, and
      low-pass filtering a result of a buffering of the voltage-divided gate voltage signal;
   a first fault status circuit configured to produce a first fault indication by:
      performing a comparison of the conditioned gate voltage signal to a first fault reference voltage, and
      asserting the first fault indication in response to the comparison indicating that the conditioned gate voltage signal is greater than the first fault reference voltage during a first interval that begins at an assertion of an input signal,
      wherein the first fault reference voltage is set according to a value of the conditioned gate voltage signal corresponding to a Miller voltage of the power transistor; and
   a fault signaling circuit configured to produce a fault signal by:
      determining a second interval having a pre-determined duration and starting at a de-assertion of the input signal,
      asserting the fault signal in response to the first fault indication being asserted outside the second interval, and
      resetting the fault signal during the second interval,
      wherein assertion of the input signal indicates that the power transistor is to be turned on, and de-assertion of the input signal indicates that the power transistor is to be turned off.

2. The circuit of claim 1, further comprising:
   a second fault status circuit configured to produce a second fault indication by asserting the second fault indication when the conditioned gate voltage signal is greater than a second fault reference voltage, the second fault reference voltage being greater than the first fault reference voltage,
   wherein the fault signaling circuit is further configured to produce the fault signal by asserting the fault signal in response to the second fault indication being asserted.

3. The circuit of claim 2, wherein the second fault reference voltage corresponds to a value of the conditioned gate voltage signal greater than the value of the conditioned gate voltage signal when the gate voltage of the power transistor is equal to a maximum gate voltage present on a gate of the power transistor during normal operation.

4. The circuit of claim 1, further comprising:
   a soft-off driver circuit configured to pull down the gate voltage to a clamp voltage when the fault signal is asserted, and to pull down the gate voltage to ground after a soft-off delay time has elapsed from the assertion of the fault signal.

5. The circuit of claim 1,
wherein the first fault reference voltage is set to be greater than the value of the conditioned gate voltage signal corresponding to the Miller voltage of the power transistor, and
wherein a duration of the first interval corresponds to a time after the assertion of the input signal when a Miller plateau occurs in the gate voltage of the power transistor under normal operation.

6. The circuit of claim 1, wherein the power transistor is an Insulated Gate Bipolar Transistor or a Metal Oxide Semiconductor Field Effect Transistor.

7. A circuit configured to detect faults, the circuit comprising:
a gate voltage signal input configured to receive a gate voltage signal indicating a gate voltage of a power transistor;
an input signal input configured to receive an input signal used to control the gate voltage of the power transistor;
a conditioning circuit configured to produce a conditioned gate voltage signal according to the gate voltage signal by:
voltage dividing the gate voltage signal, and
low-pass filtering a buffering of the voltage-divided gate voltage signal;
a first fault status circuit configured to produce a first fault indication according to the input signal and the conditioned gate voltage signal, the first fault indication indicating an over-current fault, a hard switching fault, or both, the first fault status circuit comprising:
a comparator having a positive input coupled to the conditioned gate voltage signal and a negative input coupled to a first fault reference voltage, the first fault reference voltage being determined according to a value of the conditioned gate voltage signal corresponding to a Miller voltage of the power transistor; and
a fault signaling circuit configured to produce a fault signal by: generating a pulse having a duration equal to a second interval by asserting the pulse for the second interval in response to a de-assertion of the input signal, de-asserting the fault signal in response to the pulse being asserted, and asserting the fault signal in response to the first fault indication being asserted when the pulse is not asserted.

8. The circuit of claim 7, wherein the first fault status circuit further comprises:
a delay circuit configured to de-assert an output disable signal for the duration of a first delay in response to an assertion of the input signal and to assert the output disable signal otherwise;
an output circuit configured to assert the first fault indication when an output of the comparator is asserted and the output disable signal is de-asserted and to de-assert the first fault indication otherwise.

9. The circuit of claim 8, wherein the first fault reference voltage is set to have a value higher than the value of the conditioned gate voltage signal when the gate voltage is equal to the Miller voltage of the power transistor, and
wherein the duration of the first delay corresponds to an interval between the assertion of the input signal and an expected time of occurrence of a Miller plateau during normal operation of the power transistor.8

10. The circuit of claim 7, further comprising:
a second fault status circuit configured to produce a second fault indication according to the conditioned gate voltage signal, the second fault indication indicating a fault under load,
wherein the fault signaling circuit is further configured to produce the fault signal by asserting the fault signal in response to the second fault indication being asserted.

11. The circuit of claim 10, wherein the second fault status circuit comprises:
a comparator having a positive input coupled to the conditioned gate voltage signal, a negative input coupled to a second fault reference voltage, and an output coupled to the second fault indication,
wherein the second fault reference voltage corresponds to a voltage higher than a value of the conditioned gate voltage signal when the gate voltage is equal to a maximum gate voltage present on a gate of the power transistor during normal operation.

12. The circuit of claim 7, wherein the fault signaling circuit comprises:
a pulse generator circuit having an input coupled to the input signal and an output, and configured to produce a pulse on the output in response to the de-assertion of the input signal;
a set-reset flip-flop having a set input coupled to the first fault indication, a reset input coupled to the output of the pulse generator circuit, and an output coupled to the fault signal.

13. The circuit of claim 7, further comprising a soft off driver circuit, the soft off driver circuit comprising:
a first transistor having a control input coupled to the fault signal, a first conduction terminal coupled to ground, and a second conduction terminal coupled to a first terminal of a Zener diode;
the Zener diode having a second terminal coupled to the gate voltage signal;
a delay circuit having an input coupled to the fault signal; and
a second transistor having a control input coupled to an output of the delay circuit, a first conduction terminal coupled to ground, and a second conduction terminal coupled to the gate voltage signal.

14. A method of detecting faults, the method comprising:
receiving an input signal used to control a gate voltage of a power transistor;
receiving a gate voltage signal corresponding to the gate voltage;
generating a conditioned gate voltage signal using the gate voltage signal by:
voltage dividing the gate voltage signal, and
low-pass filtering a buffering of the voltage-divided gate voltage signal;
performing a first comparison of the conditioned gate voltage signal to a first fault reference voltage, the first fault reference voltage being set to a value corresponding to a value of the conditioned gate voltage signal corresponding to a Miller voltage of the power transistor;
determining a first time period having a first predetermined duration and starting at an assertion of the input signal,
determining a second time period having a second predetermined duration and starting at a de-assertion of the input signal,
in response to the first comparison indicating that the conditioned gate voltage signal is greater than the first fault reference voltage:

asserting a fault signal when the indication occurs during the first time period, and not asserting the fault signal when the indication occurs during the second time period; and de-asserting the fault signal during the second time period.

15. The method of claim 14, wherein the first fault reference voltage has a value greater than the value of the conditioned gate voltage signal corresponding to the gate voltage being equal to the Miller voltage of the power transistor, and wherein a duration of the first time period corresponds to an interval between an assertion of the input signal and an expected end of a Miller plateau during normal operation.

16. The method of claim 14, further comprising:

performing a second comparison of the conditioned gate voltage signal to a second fault reference voltage; and in response to the second comparison indicating that the conditioned gate voltage signal is greater than the second fault reference voltage: asserting the fault signal when the indication of the second comparison occurs outside the second time period, and not asserting the fault signal when the indication of the second comparison occurs during the second time period.

17. The method of claim 16, wherein the second fault reference voltage is greater than a value of the conditioned gate voltage signal corresponding to the gate voltage being equal to a maximum gate voltage present on a gate of the power transistor during normal operation.

18. The method of claim 14, further comprising:

in response to the assertion of the fault signal, performing gate voltage clamping of the power transistor, soft turn off of the power transistor, or both.

* * * * *